United States Patent [19]

Zogg

[11] Patent Number: 4,514,702

[45] Date of Patent: Apr. 30, 1985

[54] LOGARITHMIC ELECTRONIC GAIN CONTROL CIRCUIT

[75] Inventor: Urs Zogg, Regensdorf, Switzerland

[73] Assignee: U.S. Philips Corporation, New York, N.Y.

[21] Appl. No.: 455,345

[22] Filed: Jan. 3, 1983

[30] Foreign Application Priority Data

Feb. 8, 1982 [DE] Fed. Rep. of Germany ....... 3204217

[51] Int. Cl.³ .......................... H03F 3/45; H03G 3/30
[52] U.S. Cl. ...................................... 330/254; 330/85; 330/260
[58] Field of Search ................ 330/85, 254, 279, 260; 358/27

[56] References Cited

U.S. PATENT DOCUMENTS

4,379,995  4/1983  Yamada et al. ..................... 330/254

Primary Examiner—James B. Mullins
Attorney, Agent, or Firm—Robert T. Mayer; Steven R. Biren

[57] ABSTRACT

The invention relates to an electronic gain control arrangement with a logarithmic control characteristic. Use is made of the property of current amplifier circuits having bipolar transistors that the current distribution varies as an exponential function of the control voltage. The circuit arrangement is symmetrical, so that even harmonics are compensated for.

9 Claims, 2 Drawing Figures

LOGARITHMIC ELECTRONIC GAIN CONTROL CIRCUIT

BACKGROUND OF THE INVENTION

The invention relates to an electronic gain-control arrangement, i.e. to a circuit arrangement whose gain can be varied by means of a control voltage. Such a circuit arrangement is known from DE-PS 24 04 331. The arrangement described therein comprises two converter circuits whose high-impedance outputs are each connected to the inputs of a current distribution circuit. Two outputs of the current distribution circuits, whose output currents can be controlled by the control voltage on the control input of the current distribution circuit, have a common resistor through which the output currents flow. The voltage across this resistor is applied to the inputs of the two converter circuits via an amplifier so as to obtain negative feedback, the input signal of the circuit arrangement also being applied to one converter circuit.

In many cases the control characteristic of such a circuit arrangement should be such that the amplitude of the output voltage is related to the control voltage exactly in accordance with an e-function, which is referred to hereinafter as "dB-linear". The known circuit arrangement, however, a dB-linear control characteristic over a very small amplification range and moreover produces comparatively strong even harmonics at its output. The last-mentioned disadvantage is mitigated in the circuit arrangement in accordance with German Patent Application P 30 24 142.0. This arrangement in addition comprises two further current-distribution circuits and two further converter circuits, the phase of the signal applied to the additional current-distribution circuits via the additional converter circuits being opposed to that of the signal applied to the two other current distribution circuits. The output voltage is subtracted. However, this circuit arrangement also has a dB-linear control characteristic over only a comparatively small range.

From U.S. Pat. No. 3,714,462, an electronic gain control arrangement is known which comprises two pnp and two npn-transistors and which has a dB-linear control characteristic over a comparatively large range if the characteristics of these transistors correspond to each other. However, since this requires the use of transistors of opposite conductivity types with matching characteristics, this circuit arrangement cannot readily be constructed in integrated circuit technology.

SUMMARY OF THE INVENTION

It is the object of the present invention to provide a circuit arrangement having a dB-linear control characteristic over a comparatively large range and whose properties are determined by transistors of one conductivity type.

In accordance with a first solution to this problem, which solution is based on an electronic gain control arrangement comprising a first converter circuit having a high-impedance output which is connected to the signal input of a first current distribution circuit, whose output current ratio is variable as an exponential function of the control voltage on its control input, and comprising a second current distribution circuit whose control input is arranged in parallel with the control input of the first current distribution circuit and whose signal input is connected to the high-impedance output of a second converter circuit, an amplifier being provided whose input voltage is formed by the superposition of the two output currents of the two current distribution circuits, which output currents are varied oppositely by the control signal, and whose output voltage is applied to the input of the second converter circuit so as to obtain negative feedback, the signal on the input of the first converter circuit is independent of the output signal of the amplifier and is determined only by the input signal of the arrangement.

In accordance with a second solution, which is based on an electronic gain control arrangement comprising two current distribution circuits each having two outputs, the output current ratio being controllable as an exponential function of the control voltage on their control inputs, there is provided a current control circuit which supplies signal currents which are equal but in phase opposition to the inputs of the current distribution circuits and which controls their amplitudes depending on the input signal of the arrangement in such a way that the output currents on each one of the two outputs of the two current distribution circuits are proportional to the input signal and independent of the control voltage, and the output signal of the arrangement is derived from at least one of the output currents of the two other outputs of the current distribution circuits, which output currents are controlled in the same sense by the control voltage.

Both solutions employ a current distribution circuit in which the ratio of the output currents is an exponential function of the control voltage on the control input of the current distribution circuit. Current distribution circuits of this type are known. In simplest form they comprise two emitter-coupled bipolar transistors. The interconnected emitters from the signal input of the current distribution circuit and the two collectors form the two outputs of the current distribution circuit. The control voltage is applied to the base electrodes of the two transistors. In principle, the dB-linear characteristic is determined only by the characteristics of these transistors of the same conductivity type which form the current distribution circuits.

When the first solution mentioned above is used, the input signal current of the current distribution circuit remains constant and independent of the control circuit, but if the second solution mentioned above is adopted only the current in one branch of the current distribution circuits remains independent of the control voltage, as a result of which the current in the other branch of the current distribution circuit increases exponentially so that the output signal of the arrangement can be derived from this current.

An advantage of the second circuit arrangement compared with the first one is that in the case of a symmetrical design the arrangement produces substantially no even harmonics. However, in the case of the first solution this advantage can also be obtained if, in accordance with a further embodiment of the invention, the arrangement comprises a third and a fourth current distribution circuit similar to the first and the second current distribution circuits, the control inputs of said third and fourth current distribution circuits also receiving the control voltage, the first and the second converter circuit each have outputs which are in phase opposition, the outputs of the first converter circuit are connected to the signal inputs of the first and the third current distribution circuit and the outputs of the second converter circuit are connected to the signal inputs of the second and the fourth current distribution circuit, the output currents of the first and the third current distribution circuit respectively, whose output-current amplitudes are controlled in the same sense by the control voltage, are superimposed on the output currents of the second and the fourth current distribution circuit respectively, whose output currents are influenced oppositely by the control voltage, and the input signal of the amplifier is derived from the difference of the superimposed output currents.

BRIEF DESCRIPTION OF THE DRAWING

The invention will now be described in more detail, by way of example, with reference to the drawing. In the drawing.

DESCRIPTION OF THE PREFERRED EMBODIMENTS

Figure 1:
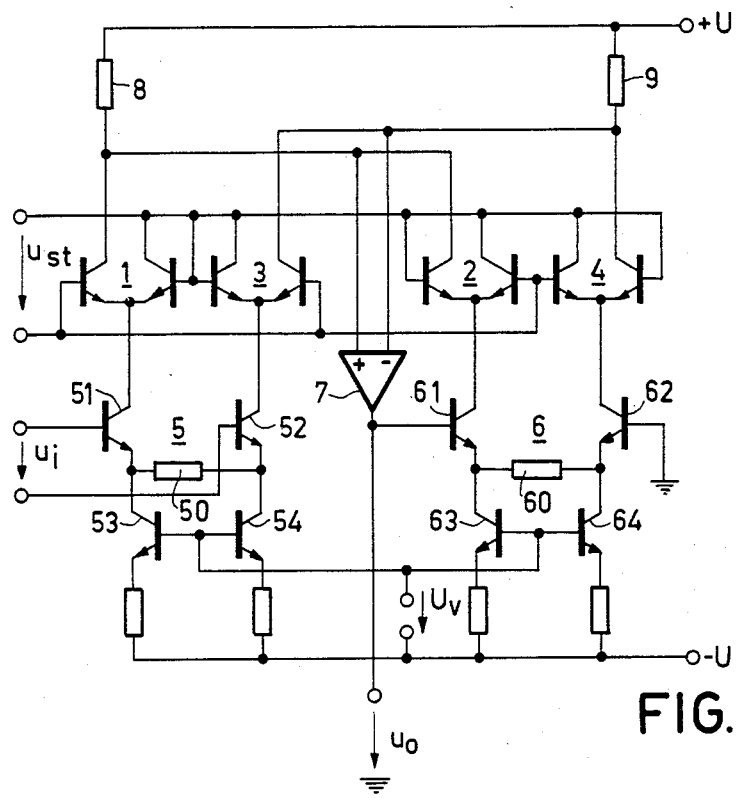
FIG. 1 shows an embodiment utilizing the first solution.

The circuit arrangement shown in FIG. 1 comprises four current distribution circuits 1 ... 4, which each comprise two bipolar transistors of the same conductivity type, suitably of the npn type, whose emitters are interconnected. As is known, the current applied to the emitters of such a transistor pair is distributed by a control voltage applied to the bases of said transistors in such a way that the quotient of the collector currents is an exponential function of the control voltage.

The four transistors of the first and the second, and of the third and the fourth, current distribution circuit, respectively, are cross-coupled to each other, i.e. each of the four transistors has one single similar electrode in common with the three other transistors (for example, the two left-hand transistors of the current distribution circuits 1 and 2 have their collectors in common etc.). The d.c. control voltage $u_{st}$ is applied between the base electrodes of the transistors of each (individual) current distribution circuit, as shown in FIG. 1.

The inputs of the first and the third current distribution circuit 1 and 3 respectively, i.e. the interconnected emitters of the two transistors of these current distribution circuits, are connected to the opposite-phase outputs of a first converter circuit 5. The function of the converter circuit 5 is to convert an input signal $u_i$ applied to its input into two signal currents of equal amplitude and opposite phase on its outputs.

For this purpose the converter circuit 5 comprises two npn transistors 51, 52, whose collectors constitute the opposite-phase outputs of the converter circuit, between whose base connections the input signal $u_i$ is applied and in whose emitter lines d.c. sources 53 and 54 respectively are included, which sources are each formed by the collector-emitter junction of an npn transistor with an emitter resistor, a suitable bias voltage $U_v$ being applied to the bases of the transistors. The connections of the current sources 53 and 54 which are remote from the transistors 51 and 52 are coupled to a negative supply-voltage terminal $-U$. Between the emitters of the two transistors 51 and 52 a two-terminal network 50 is arranged, which network may comprise a resistor, a capacitor or an inductor and also a combination of these elements, if required in conjunction with an active circuit. The signal current through this two-terminal network is proportional to the input voltage $u_i$ between the bases of the transistors 51 and 52, of which one base may be connected to a suitable reference potential, for example ground, and has the value $u_i/Z_1$, $Z_1$ being the impedance of the two-terminal network 50.

The high-impedance opposite-phase outputs of a second converter circuit 6 are connected to the inputs of the second and fourth current distribution circuit 2 and 4 respectively, which second converter circuit has a similar circuit arrangement to that of the converter circuit 5. Consequently, it comprises two transistors 61 and 62, whose collectors are connected to the commoned emitters of the current distribution circuits 2 and 4, respectively, whose emitters are connected to the negative supply-voltage terminal $-U$ via current sources 63 and 64 respectively and are interconnected via a two-terminal network 60, the base of the transistor 62 being connected to ground and the base of the transistor 61 being connected to the output of an operational amplifier 7. The current through the two-terminal network then has the value $u_O/Z_2$, $U_0$ being the output voltage of the operational amplifier 7 and $Z_2$ the impedance of the two-terminal network 60.

At its outputs, the converter circuit 5 produces currents of the value $u_i/Z_1$ which are in phase opposition and which are distributed by the current distribution circuits 1 and 3 in conformity with the control voltage $u_{st}$. The collector of the left-hand transistor of the current distribution circuit 1 and the collector of the right-hand transistor of the current distribution circuit 3, whose bases are interconnected, in other words those outputs on which the output currents appear whose amplitudes are influenced in the same sense by the d.c. control voltage $u_{st}$, are connected to resistors of equal value, 8 and 9 respectively, whose other ends are connected to a positive supply-voltage terminal $+U$. Moreover, an output of the current distribution circuit 2 is connected to the resistor 8 and an output of the current distribution circuit 4 is connected to the resistor 9, these outputs being those on which the output current amplitudes vary as a function of the control voltage $u_{st}$ in a sense opposite to the amplitude of the output currents on the outputs of the current distribution circuits 1 and 3 which are connected to the resistors 8 and 9. As a result of this, the current distribution circuits 1 and 3 supply equal alternating currents of opposite phase to the resistors 8 and 9. The same applies to the current distribution circuits 2 and 4. Consequently, the voltage across the resistor 8 is determined by the superposition of the output currents of the current distribution circuits 1 and 2, while the voltage across the resistor 9 is determined by the superposition of the output currents of the current distribution circuits 3 and 4.

The voltages across the resistors 8 and 9 are applied to the two inputs of a differential amplifier 7, namely in such a phase relationship that the elements 7, 61, 2 and 8 and the elements 7, 62, 4 and 9, respectively, each form a negative feedback loop.

It can be demonstrated that in such a circuit arrangement the signal voltage across each of the resistors 8 and 9 is substantially zero and that the gain $v = u_O/u_i$ satisfies the equation $$V = (Z_2/A_1) \cdot e^{-c} \tag{1}$$

if the inequality $$V >> \frac{1+e^c}{e^c} \cdot \frac{R_8 + R_9}{Z_2} \qquad (2)$$

is met. Here e is the base of the natural logarithm, c is a value which corresponds to the quotient of the control voltage $u_{st}$ and the thermal voltage ($u_T \approx 26$ mV at 300 K) or the logarithm of the quotient of the output currents of a current distribution circuit, which is positive in the case of the polarity of $u_{st}$ as indicated in the drawing, and $R_8$ and $R_9$ are the resistance values of the resistors 8 and 9.

Current distribution circuits as shown in FIG. 1 generally give rise to even harmonics. However, the harmonics in the output currents of the current distribution circuits 1 and 3 on the one hand and the current distribution circuits 2 and 4 on the other hand, which currents flow through the resistors 8 and 9 respectively, are in phase, so that they compensate each other on the output of the differential amplifier 7.

The resistors 8 and 9 need not be equal to each other in order to obtain a dB-linear control characteristic. However, the even harmonic are compensated to a smaller extent as the values of the resistors 8 and 9 differ more from each other. In the extreme case, one half of the circuit arrangement—for example the resistor 9, the current distribution circuits 3 and 4 and the elements 52, 54 and 62, 64 respectively of the converter circuits 5 and 6—may be dispensed with if the input of the operational amplifier 7 which is connected to the resistor 9 is at a suitable d.c. potential; however, then the even harmonics will no longer cancel each other and will appear fully in the output voltage $u_O$.

It is to be noted that the potential on the input of the converter 5 must be more positive than the potential −U on the negative supply voltage terminal and may, for example, be zero volts. The potential on the control inputs to which the control voltage $u_{st}$ is applied, should then be more positive than the potential on the input terminals of the converter 5 by a few times the base-emitter bias in order to ensure correct operation.

Figure 2:
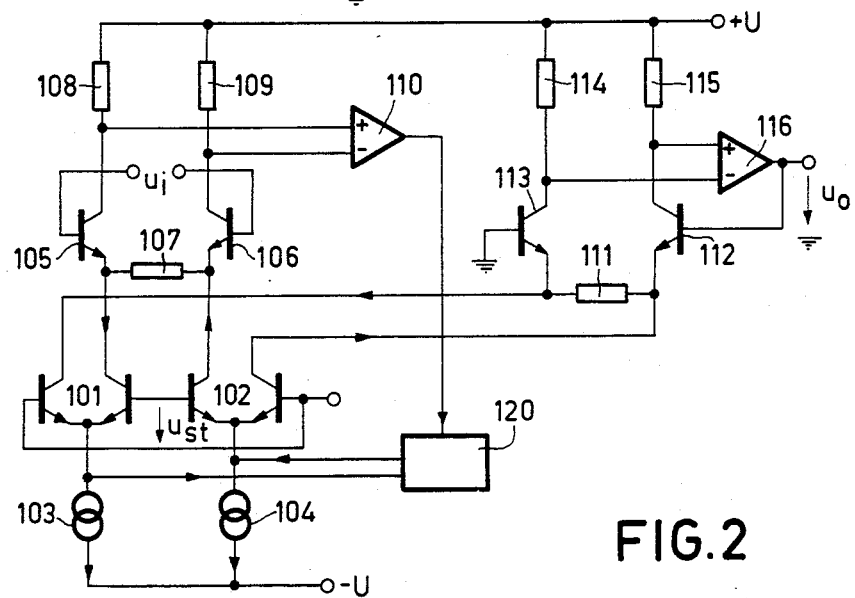
FIG. 2 shows an embodiment utilizing the second solution.

The embodiment shown in FIG. 2, which utilizes the second solution, comprises current distribution circuits 101 and 102, having the same circuit design as the current distribution circuits 1 to 4 in FIG. 1. The base of one transistor of a current distribution circuit is connected to the base of a transistor of the other current distribution circuit. A control voltage $u_{st}$ acts between the bases of the npn transistors forming each current distribution circuit. The inputs of the current distribution circuits 101 and 102, respectively, i.e. the emitters of the npn transistors constituting the current distribution circuits, are connected to a supply voltage terminal carrying a negative potential −U via a d.c. source, 103 and 104, respectively. The collectors of two transistors of the current distribution circuits 101 and 102, whose bases are interconnected, i.e. those outputs of the current distribution circuits whose output-current amplitudes are varied in the same sense by the control voltage $u_{st}$, are connected to the emitters of two transistors 105 and 106, between which a two-terminal network 107 is arranged. The input signal $u_i$ is applied between the base electrodes of the transistors 105 and 106, and their collectors are connected to a supply voltage terminal carrying a positive potential +U via resistor 108 and 109. However, instead of the individual transistors 105 and 106, any other circuit arrangement may be chosen having a low-impedance follower output and a further, high-impedance output, for example a Darlington arrangement, while the outputs of the current distribution circuits 101, 102 may be connected to the emitters of the output transistors of the Darlington arrangement or alternatively to the emitters of the preceding transistors.

The voltage across the resistors 108 and 109, which suitably have the same values, is amplified by an operational amplifier 110 and applied to the input of a converter circuit 120, which converts said voltage into signal currents of equal amplitude but opposite phase, which are proportional to the output voltage of the amplifier 110, which signal currents are applied to the inputs of the current distribution circuits 101 and 102 respectively with such a phase that negative feedback is obtained.

It can be demonstrated that in this circuit arrangement the signal voltage on each of the two inputs of the operational amplifier 110 becomes substantially zero or that the collector signal currents are negligible relative to the current through the two-terminal network 107, if the product of the resistance value of one of the resistors 108 and 109, the gain of the operational amplifier 110 and the slope of the converter circuit 120 is large in comparison with the expression $1+e^c$. However, this means that the currents on the outputs of the current distribution circuit 101 and 102, which are connected to the transistors 105 and 106, have the same values and correspond to the current through the two-terminal network 107, which current is given by the relationship $u_i/Z_1$, where $Z_1$ is the impedance of the two-terminal network 107—regardless of the control voltage $u_{st}$.

Thus, the two current distribution circuits 101 and 102 are arranged in a control loop or negative feedback loop which ensures that the signal currents on the outputs connected to the transistor 105 and 106 respectively become proportional to the input voltage $u_i$, namely independently of the control voltage $u_{st}$. This is because the high gain in the negative feedback loop or feedback loop ensures that the currents through the resistors 108 and 109 are negligible relative to the current through the resistor 107. In the case of a deviation, the alternating currents supplied by the current converter 120 change in such a way that the signal current or the signal-voltage drop across the resistors 108 and 109 respectively is again negligible.

Since, as is known, the ratio of the currents on the two outputs of such a current circuit, is an exponential function of the control voltage, the currents on those outputs of the current distribution circuits 101 and 102 which are not connected to the transistors 105 and 106 are a factor $e^{-c}$ smaller or greater than the current through the resistor 107, c having a positive or a negative value depending on the polarity of the control voltage $u_{st}$. Therefore, the signal voltage drop produced across a resistor connected to one of these outputs divided by the input signal voltage $u_i$ would be an exponential function of the control $u_{st}$, but such an output voltage would be available across a comparatively high impedance and would not be free of second harmonics. However, if the output currents or signals which are proportional thereto are subtracted from each other, compensation for the even harmonics is obtained because said harmonics in the output current are in phase while the actual signal components in the output currents are in phase opposition.

For this purpose those outputs of the current distribution circuits 101 and 102 which are not connected to the transistors 105 and 106 are interconnected via a second impedance 111. If the voltage across this impedance is regarded as the output voltage, the gain in equation (1) is adequate if $Z_2$ is the impedance of the second two-terminal network 111. However, as this still results in a comparatively high output resistance, the two-terminal network 111 is arranged between the emitter connections of two npn transistors 112 and 113, whose collectors are connected to the positive supply voltage terminal $+U$ via resistors 114 and 115 of equal value. The base of one of the two transistors (113) is connected to a reference potential, for example ground, the base of the other transistor (112) to the output of an operational amplifier 116, which amplifies the difference between the voltage drops across the resistors 114 and 115, in such a way that a negative feedback is obtained. The output voltage $u_O$ of this operational amplifier corresponds to the voltage across the two-terminal network 111, but is now available at a low impedance voltage terminal and is asymmetrical relative to earth.

During the half-cycle of the input signal indicated by the current arrows, the transistor 105 and the transistors of the current distribution circuit 101 are more conductive than the transistor 106 and the transistors of the current distribution circuit 102, respectively. During the opposite half-cycle the situation is reversed. This results in a push-pull operation, which as is known, does not give rise to even harmonics.

As already stated, the two circuit arrangements shown in FIG. 1 and FIG. 2 not only have the principle mentioned above in common but also the fact that the gain depends in exactly the same way on the control voltage $u_{st}$ and on the inpedances $Z_1$ and $Z_2$ (cf. equation (1)). Therefore, the circuit arrangements may be employed for similar purposes. If the first and the second impedances 50, 60 and 107, 111, respectively, are real or if their phase angles vary in the same way as a function of the frequency, the circuit arrangement may be used for electronic gain control, in order to vary the gain uniformly over a wider frequency band, or they may be used as volume control circuits in an audio amplifier. The gain can then be determined by a suitable choice of $Z_1$ and $Z_2$.

Such a circuit arrangement is also suitable for automatic gain control in RF receivers.

However, if one of the two impedances is frequency-dependent in a different manner the frequency response may be influenced depending on the control voltage $u_{st}$ or a frequency-dependent gain control is possible, which permits its use as a filter with voltage-controlled cut-off frequency or as tone control in audio amplifiers. If the first two-terminal network 50 or 107 is a resistor and the second two-terminal network 60 or 111 is a capacitor or a capacitive impedance, an integrator with electronically controllable time constant is obtained, which may for example be used in control technology.

In both cases the phase of the output signal may be shifted through 180° by interchanging the input connections.

What is claimed is:

1. An electronic gain-control circuit arrangement composed of transistors of only one conductivity type and comprising a first converter circuit having a high-impedance output which is connected to the signal input of a first current distribution circuit, whose output current ratio is variable as an exponential function of the control voltage on its control input, a second current distribution circuit whose control input is arranged in parallel with the control input of the first current distribution circuit and whose signal input is connected to the high-impedance output of a second converter circuit, an amplifier whose input voltage is formed from the superposition of the two output currents of the two current distribution circuits, which output currents are varied oppositely by the control signal, and whose output voltage is applied to the input of the second converter circuit so as to obtain negative feedback, and means for determining the signal on the input of the first converter circuit independently of the output signal of the amplifier and only as a function of the input signal of the circuit arrangement.

2. An arrangement as claimed in claim 1, further comprising a third and a fourth current distribution circuit similar to the first and the second current distribution circuits, the control inputs of said third and fourth current distribution circuits also receiving the control voltage, the first and the second converter circuit each having outputs which are in phase opposition, the outputs of the first converter circuit being connected to the signal inputs of the first and the third current distribution circuit and the outputs of the second converter circuit being connected to the signal inputs of the second and the fourth current distribution circuit, means for superimposing the output currents of the first and the third current distribution circuits, respectively, whose output-current amplitudes are controlled in the same sense by the control voltage, on the output currents of the second and the fourth current distribution circuit, respectively, whose output currents are oppositely influenced by the control voltage, and means for deriving the input input signal on the amplifier from the difference of the superimposed output currents.

3. An arrangement as claimed in claim 2, wherein the first and the second converter each comprise two transistors, between whose emitters a first and a second two-terminal network, respectively, is arranged, and in whose emitter lines constant-current sources are arranged, the input signal of each of the converter circuits being applied to the base electrodes of the transistors and the output signal being derived from the collector currents of the transistors.

4. An electronic gain-control arrangement composed of transistors of only one conductivity type and comprising two current distribution circuits each having first and second outputs, the output current ratio being controllable as an exponential function of the control voltage on their control inputs, a current control circuit, which supplies signal currents which are equal but in phase opposition to the inputs of the current distribution circuits and which controls their amplitude depending on the input signal of the arrangement such that the output currents on each one of the two outputs of the two current distribution circuits are proportional to the input signal and independent of the control voltage, and means for deriving the output signal of the arrangement from at least one of the output currents of the two other outputs of the current distribution circuits, which output currents are controlled in the same sense by the control voltage.

5. An arrangement as claimed in claim 4, wherein the current control circuit comprises an input converter, an amplifier connected to the output of said converter, and a current converter which converts the output signal of the amplifier into two equal currents which are in phase opposition, and which are applied to the inputs of the current distribution circuits, and the input converter comprises two symmetrically-arranged transistors between whose emitters a first two-terminal network, which is coupled to said first outputs of the current distribution circuits, is arranged, to whose bases the input signal of the arrangement is applied, and from whose collector currents the input signal of the amplifier is derived.

6. An arrangement as claimed in claim 5, wherein the output signal is formed by the difference of the currents on said second outputs of the current distribution circuits.

7. An arrangement as claimed in claim 6, wherein the output signal is applied to a second two-terminal network which is arranged between said second outputs of the current distribution circuits.

8. An arrangement as claimed in claim 3 or 7, wherein at least one of the first and second two-terminal networks comprise a frequency-dependent impedance.

9. An arrangement as claimed in claim 3 or 7, wherein the second two-terminal network comprises a capacitive impedance.

* * * * *